US009030808B2

(12) United States Patent
Hsu et al.

(10) Patent No.: US 9,030,808 B2
(45) Date of Patent: May 12, 2015

(54) SOLID ELECTROLYTIC CAPACITOR AND CIRCUIT BOARD HAVING THE SAME

(75) Inventors: Chien-Min Hsu, Hsinchu County (TW); Min-Lin Lee, Hsinchu (TW); Li-Duan Tsai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 275 days.

(21) Appl. No.: 13/607,820

(22) Filed: Sep. 10, 2012

(65) Prior Publication Data

US 2013/0233605 A1 Sep. 12, 2013

(30) Foreign Application Priority Data

Mar. 12, 2012 (TW) .............................. 101108286 A

(51) Int. Cl.
*H01G 5/38* (2006.01)
*H01G 9/04* (2006.01)
(Continued)

(52) U.S. Cl.
CPC ............... *H05K 1/162* (2013.01); *H01G 9/012* (2013.01); *H01G 9/04* (2013.01); *H01G 9/15* (2013.01); *H01G 9/26* (2013.01); *H05K 1/0231* (2013.01); *H05K 1/053* (2013.01); *H05K 2201/0116* (2013.01); *H05K 2201/0175* (2013.01); *H05K 2201/0191* (2013.01); *H05K 2201/0323* (2013.01); *H05K 2201/0329* (2013.01); *H05K 2201/0338* (2013.01); *H05K 2201/09063* (2013.01); *H05K 2201/10522* (2013.01); *H05K 2203/0307* (2013.01);
(Continued)

(58) Field of Classification Search
USPC ................. 361/523, 528, 532, 538, 760–761, 361/792–795; 174/260–262
See application file for complete search history.

(56) References Cited

U.S. PATENT DOCUMENTS 6,466,430 B2    10/2002   Mido et al.
6,504,705 B2    1/2003    Shimada et al.
(Continued)

FOREIGN PATENT DOCUMENTS

JP    2002100875    4/2002
TW    200945387     11/2009

OTHER PUBLICATIONS

K. J. Lim, et al., "Dielectric properties of aluminium solid electrolytic capacitor using conduction Polymer", IEEE, Proceedings of the 4th International Conference on Properties and Applications of Dielectric Materials, Jul. 3-8, 1994, pp. 223-226.
(Continued)

*Primary Examiner* — Eric Thomas
(74) *Attorney, Agent, or Firm* — Jianq Chyun IP Office

(57) ABSTRACT

A capacitor and a circuit board having the same are provided. The capacitor includes a substrate, an oxide layer, a second electrode, an insulating layer, a plurality of conductive sheets and a plurality of vias. The substrate includes a first electrode and a porous structure. The porous structure in at least of two distribution regions has different depths. An oxide layer is disposed on the surface of the porous structure. The second electrode is disposed on the oxide layer and includes a conductive polymer material. The insulating layer disposed on the second electrode has a third and a fourth surfaces. The fourth surface of the insulating layer is connected with the second electrode. The conductive sheets are disposed on the first surface of the first electrode and the third surface of the insulating layer and electrically connected with the corresponding vias according to different polarities.

18 Claims, 10 Drawing Sheets

(51) Int. Cl.
  *H05K 1/16* (2006.01)
  *H01G 9/012* (2006.01)
  *H01G 9/15* (2006.01)
  *H01G 9/26* (2006.01)
  *H05K 1/02* (2006.01)
  *H05K 1/05* (2006.01)

(52) U.S. Cl.
  CPC ............... *H05K 2203/0315* (2013.01); *H05K 2203/0369* (2013.01); *H05K 2203/0723* (2013.01)

(56) References Cited

U.S. PATENT DOCUMENTS

| | | | |
|---|---|---|---|
| 6,510,045 B2 | 1/2003 | Mido et al. | |
| 6,775,125 B2 | 8/2004 | Kimura et al. | |
| 6,775,126 B2 | 8/2004 | Fujii et al. | |
| 6,822,849 B2 | 11/2004 | Miki et al. | |
| 6,836,401 B2 | 12/2004 | Yoshida et al. | |
| 6,852,137 B2 | 2/2005 | Miki et al. | |
| 6,855,177 B2 | 2/2005 | Fujii et al. | |
| 6,870,728 B1 | 3/2005 | Burket et al. | |
| 6,882,544 B2 | 4/2005 | Nakamura et al. | |
| 6,917,514 B2 | 7/2005 | Mido et al. | |
| 6,980,416 B2 | 12/2005 | Sakaguchi et al. | |
| 6,989,982 B2 | 1/2006 | Kobayashi et al. | |
| 7,009,834 B2 | 3/2006 | Arai et al. | |
| 7,042,709 B2 | 5/2006 | Kobayashi et al. | |
| 7,054,141 B2 | 5/2006 | Sakaguchi et al. | |
| 7,126,811 B2 | 10/2006 | Hirano et al. | |
| 7,158,366 B2 | 1/2007 | Kobayashi et al. | |
| 7,169,195 B2 | 1/2007 | Sakaguchi et al. | |
| 7,227,739 B2 | 6/2007 | Kobayashi | |
| 7,247,178 B2 | 7/2007 | Hirano et al. | |
| 7,304,833 B1 | 12/2007 | Kobayashi | |
| 7,317,610 B2 | 1/2008 | Nakamura et al. | |
| 7,319,599 B2 | 1/2008 | Hirano et al. | |
| 7,361,568 B2 | 4/2008 | Dunn et al. | |
| 7,481,850 B2 | 1/2009 | Saito et al. | |
| 7,595,235 B2 | 9/2009 | Arai et al. | |
| 7,602,602 B2 | 10/2009 | Takahashi et al. | |
| 7,612,986 B2 | 11/2009 | Katano et al. | |
| 7,940,516 B2 | 5/2011 | Shioga et al. | |
| 2004/0246690 A1* | 12/2004 | Nakamura et al. | 361/763 |
| 2006/0120014 A1 | 6/2006 | Nakamura et al. | |
| 2007/0029675 A1 | 2/2007 | Barnett | |
| 2007/0139864 A1* | 6/2007 | Dunn et al. | 361/523 |
| 2008/0266750 A1* | 10/2008 | Wu et al. | 361/313 |
| 2009/0128993 A1 | 5/2009 | Wu et al. | |
| 2009/0180236 A1 | 7/2009 | Lee et al. | |

OTHER PUBLICATIONS

Enrico Stura, et al., "Hybrid organic-inorganic electrolytic capacitors", IEEE, Transactions on NanoBioscience, vol. 1, No. 4, Dec. 2002, pp. 141-145.

Yang Rao, et al., "Novel ultra-high dielectric constant polymer based composite development for embedded capacitor application", IEEE, Electronics Packaging Technology Conference, 2002, pp. 65-69.

Donald R. Cahela, et al., "Overview of electrochemical double layer capacitors", IEEE, Industrial Electronics, Control and Instrumentation, 1997, pp. 1068-1073.

* cited by examiner

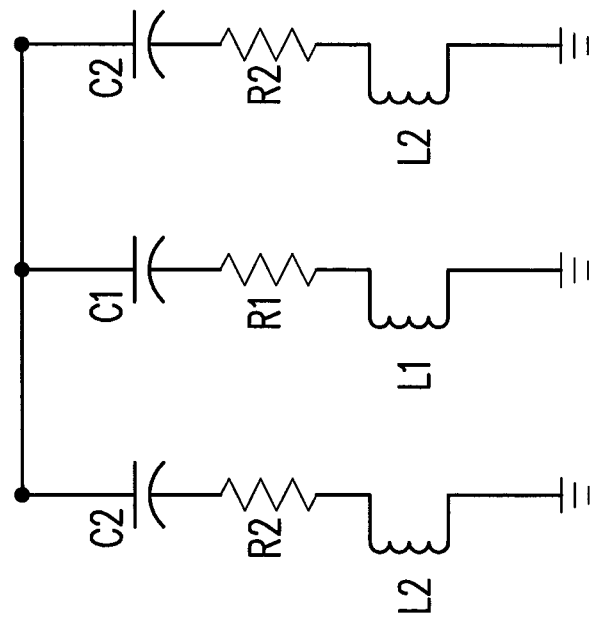
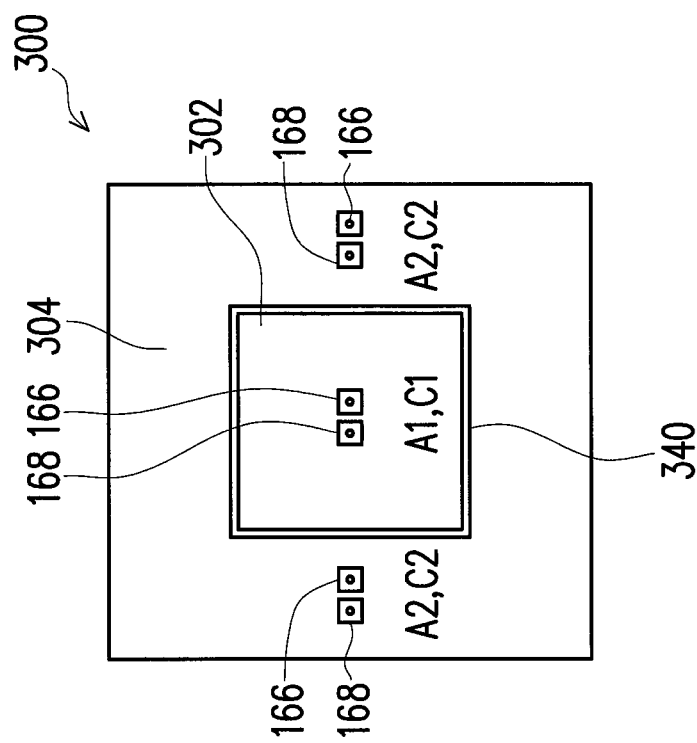
FIG. 3B
FIG. 3C

SOLID ELECTROLYTIC CAPACITOR AND CIRCUIT BOARD HAVING THE SAME

CROSS-REFERENCE TO RELATED APPLICATION

This application claims the priority benefit of Taiwan application serial no. 101108286, filed on Mar. 12, 2012. The entirety of the above-mentioned patent application is hereby incorporated by reference herein and made a part of this specification.

BACKGROUND OF THE INVENTION

1. Technical Field

The disclosure relates to a capacitor. More particularly, the disclosure relates to a solid electrolytic capacitor with low parasitic inductance and a circuit board having the same.

2. Background

The development of portable products aims at light weight, compactness, miniaturization, high-speed, low power consumption and multiple functionality. In recent years, as the IC processing technology keeps improving and the signal transmission speed keeps increasing, the interferences of simultaneous switching power noises become more severe for the printed circuit board or IC carrier board transmitting signals of higher frequencies. The common approach for lowering the power noises is to place SMD capacitors, also called decoupling capacitors or bypass capacitors, near the power/ground pin(s). By doing so, the electrical energy stored in the capacitors is supplied when electrical energy is insufficient, so as to absorb the glitch, lower the power noises and stabilize the power source.

However, for the future circuit systems of multiple functionality, the noise bandwidth becomes broader. Under the restricted area of the IC carrier board, limited amounts of SMD capacitors may be used, which will be the bottleneck for the common approach for lowering the power noises. For the embedded capacitor substrates, such as certain capacitors of metal-insulator-metal (MIM) structures, the available capacitance per area unit is unable to satisfy the large capacitance requirements of CPU carrier boards.

SUMMARY OF THE INVENTION

The disclosure is directed to a solid electrolytic capacitor.

In an exemplary embodiment of the disclosure, a capacitor is provided. The capacitor comprises a substrate having a first electrode and a porous structure, an oxide layer, a second electrode, an insulating layer, a plurality of conductive sheets and a plurality of vias. The substrate has a first electrode and a porous structure, in which the first electrode has a first surface and a second surface opposite to the first surface. The porous structure is disposed on the second surface, the porous structure in a plurality of distribution regions have different depths. The oxide layer, disposed on a surface of the porous structure. The second electrode is disposed on the oxide layer and includes a conductive polymer material layer. The insulating layer is disposed on a surface of the second electrode away from the substrate, in which the insulating layer has a third surface and a fourth surface opposite to the third surface, and the fourth surface is connected with the second electrode. The plurality of conductive sheets is respectively disposed on the first surface of the first electrode and the third surface of the insulating layer. The plurality of vias is electrically connected with the corresponding conductive sheets according to different polarities.

In an exemplary embodiment of the disclosure, a capacitor is provided. The capacitor comprises a plurality of solid electrolytic capacitor structures arranged in an array. Each solid electrolytic capacitor structure comprises a substrate, having a first electrode and a porous structure, an oxide layer, a second electrode. The first electrode has a first surface and a second surface opposite to the first surface. The porous structure is disposed on the second surface. The oxide layer is disposed on a surface of the porous structure. The second electrode is disposed on the oxide layer and including a conductive polymer material layer. The porous structures of at least two of the solid electrolytic capacitor structures have different depths. An insulating layer is disposed over the plurality of the solid electrolytic capacitor structures, in which the insulating layer has a third surface and a fourth surface opposite to the third surface and the fourth surface is connected with the second electrodes of the solid electrolytic capacitor structures. A plurality of conductive sheets is respectively disposed on the first surfaces of the first electrodes of the solid electrolytic capacitor structures and the third surface of the insulating layer. A plurality of vias is electrically connected with the corresponding conductive sheets according to different polarities.

In an exemplary embodiment of the disclosure, a capacitor is provided. The capacitor comprise a plurality of first solid electrolytic capacitor structures and a plurality of second solid electrolytic capacitor structures, arranged coplanarly and alternately arranged in an array. An insulating slot is formed between each first solid electrolytic capacitor structure and each second solid electrolytic capacitor structure. Each first solid electrolytic capacitor structure comprises a first substrate, a first oxide layer and a second electrode. The first substrate comprises a first electrode and a first porous structure. The first electrode comprises a first surface and a second surface opposite to the first surface. The first porous structure is disposed on the second surface, the first porous structure in a first distribution region having a first depth. The first oxide layer is disposed on a surface of the first porous structure. The second electrode is disposed on the first oxide layer and comprises a conductive polymer material layer. Each second solid electrolytic capacitor structure comprises a second substrate, a second oxide layer and a fourth electrode. The second substrate comprises a third electrode and a second porous structure. The third electrode comprises a third surface and a fourth surface opposite to the third surface. The second porous structure is disposed on the fourth surface, and the second porous structure in a second distribution region having a second depth. The second oxide layer is disposed on a surface of the second porous structure. The fourth electrode is disposed on the second oxide layer and comprising a conductive polymer material layer, in which the first depth is smaller than the second depth. An insulating layer has a fifth surface and a sixth surface opposite to the fifth surface, and the sixth surface of an insulating layer is connected with the second electrodes of the first solid electrolytic capacitor structures and the fourth electrodes of the second solid electrolytic capacitor structures. A plurality of conductive sheets are respectively disposed on the first surfaces of the first electrodes of the first solid electrolytic capacitor structures, on the third surfaces of the third electrodes of the second solid electrolytic capacitor structures and on the fifth surface of the insulating layer. A plurality of vias is electrically connected with the conductive sheets, respectively.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIGS. 3A, 3B and 3C respectively show the cross-sectional view, the top view and the equivalent circuit of a capacitor according to the present disclosure.

DETAILED DESCRIPTION OF DISCLOSED EXEMPLARY EMBODIMENTS

Figure 1A:
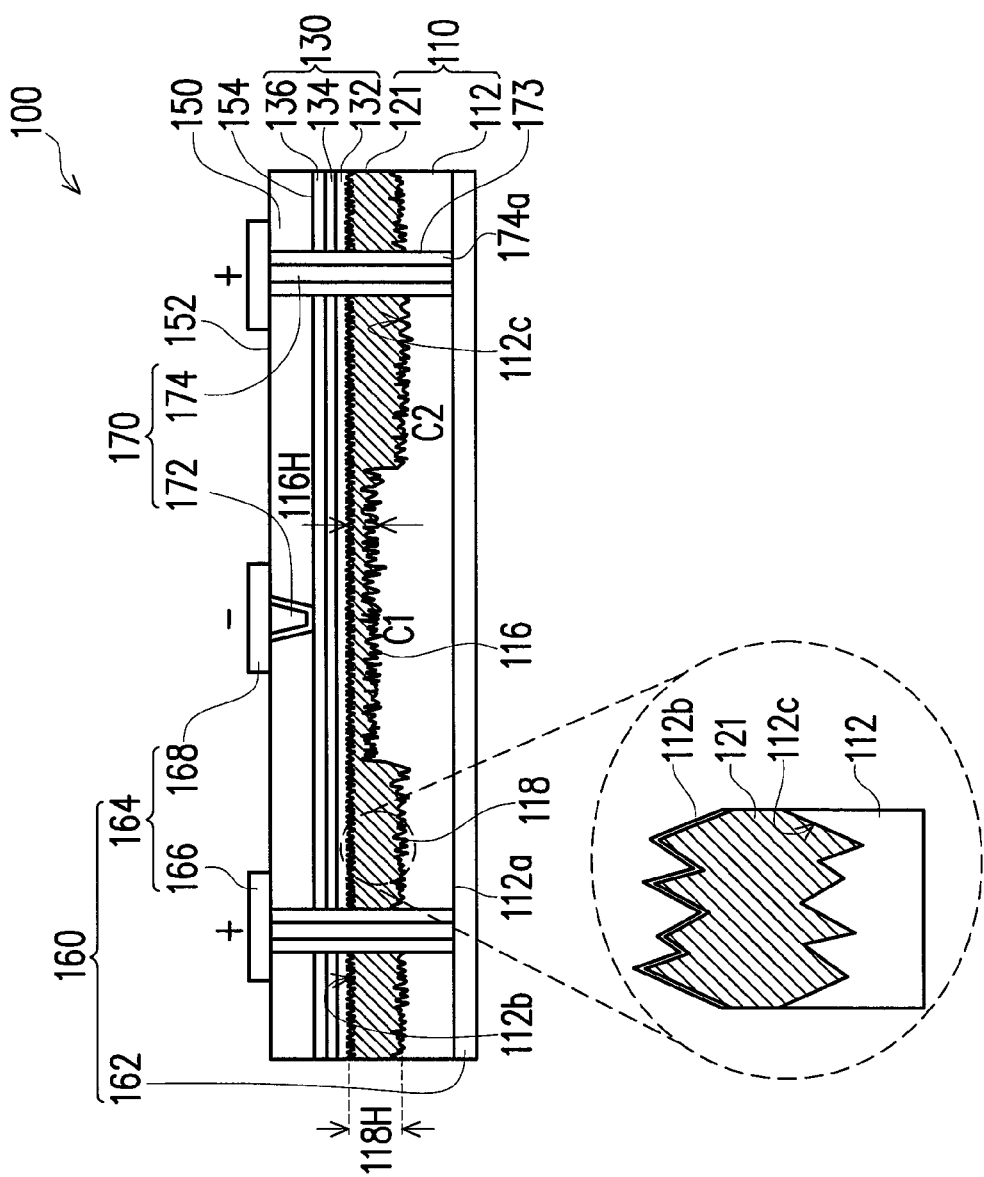
FIGS. 1A and 1B respectively show the cross-sectional view and the top view of a capacitor according to the present disclosure.

FIG. 1A shows a cross-sectional view of a capacitor according to the present disclosure. The capacitor 100, such as a solid electrolytic capacitor substrate module, may be embedded in the printed circuit board or within IC carrier board. The capacitor 100 includes a substrate 110, an oxide layer 112$b$, a second electrode 130, an insulating layer 150, a plurality of conductive sheets 160 and a plurality of vias 170. The substrate 110 includes a first electrode 112 and a porous structure 121. Through etching processes, the porous structure 121 is located in various distribution regions (116, 118) and has different depths (116H, 118H). The porous structure 121 includes a high surface area interface, when compared with the conventional MIM plate capacitor. By controlling the etching processes to the regions of the substrate 110, the porous structure 121 has a variety of depths.

Referring to FIG. 1A, the substrate 110 may be an aluminum substrate, for example. After the etching processes, the substrate 110 includes the first electrode 112 and the porous structure 121. The first electrode 112 has a first surface 112$a$ and a second surface 112$c$ opposite to the first surface 112$a$, the porous structure 121 is disposed on the second surface 112$c$ of the first electrode 112. The porous structure 121 fabricated by the electrochemical process is uneven and jagged. From the cross-sectional view of FIG. 1A, the surfaces of the porous structure 121 are shown as irregular serrations. Through the electrochemical process, an oxide layer 112$b$ is formed on the surface of the porous structure 121. The oxide layer 112$b$ made of aluminum oxide ($Al_2O_3$), for example, covers the top surface of the porous structure 121. The oxide layer 112$b$ made of the insulating material can function as the dielectric layer of the capacitor structure. As shown in the enlarged partial view of FIG. 1A, the oxide layer 112$b$ covers the top surface (shown as the serrations) of the porous structure 121. The porous structure 121 has at least a first distribution region 116 and at least a second distribution region 118. The porous structure 121 in the first distribution region 116 has a first depth 116H, while the porous structure 121 in the second distribution region 118 has a second depth 118H. The first depth 116H is smaller than the second depth 118H.

The second electrode 130 is disposed on the oxide layer 112$b$. In one embodiment, a conductive polymer material layer 132 coated on the oxide layer 112$b$ and the second electrode 130 may be the conductive polymer material layer 132 alone. In another embodiment, the second electrode 130 further includes a carbon-containing layer 134 and a conductive silver paste layer 136 for better electrical conductivity. In another embodiments, solder paste can be used to replace the silver paste. The carbon-containing layer 134 is disposed on the conductive polymer material layer 132 and the conductive silver paste layer 136 is disposed on the carbon-containing layer 134.

The insulating layer 150 is disposed on the second electrode 130 of the capacitor 100, and the insulating layer 150 includes a third surface 152 and a fourth surface 154. The fourth surface 154 is in contact with the second electrode. A plurality of conductive sheets 160 is respectively disposed on the first surface 112$a$ of the first electrode 112 and the third surface 152 of the insulating layer 150. In this embodiment, the plurality of conductive sheets 160 includes a first conductive sheet 162 and a plurality of second conductive sheets 164. The first conductive sheet 162 is electrically connected with the first surface 112$a$ of the first electrode 112, while the second conductive sheets 164 are disposed on the third surface 152 of the insulating layer 150.

The vias 170 includes a plurality of blind vias 172 and a plurality of through vias 174 penetrating the insulating layer 150. The first conductive sheet 162 and the plurality of second conductive sheets 164 electrically connect with the corresponding vias according to different polarities. For example, the blind via 172 is electrically connected with a negative electrode conductive sheet 168 of the second conductive sheets 164 and with the second electrode 130 through a conductive layer of the blind via 172. The through vias 174 are formed within a plurality of the insulating holes 173 in the capacitor 100, penetrating through the insulating layer 150, the second electrode 130 and the substrate 110. The through vias 174 are made of, for example, conductive materials. The insulating material layer 174$a$ is formed between the insulating holes 173 and the through vias 174. Hence, the through vias 174 and the second electrode 130 are electrically isolated. The diameter of the through vias 174 is smaller than the diameter of the insulating holes 173. The through vias 174, penetrating through the insulating material layer 174$a$, are electrically connected with a positive electrode conductive sheet 166 of the second conductive sheets 164 and with the first conductive sheet 162.

In this embodiment, the first electrode 112 is a positive electrode, electrically connected to the first conductive sheet 162 and electrically connected to the positive electrode conductive sheet 166 of the second conductive sheets 164 via the through vias 174. The second electrode 130 is a negative electrode, electrically connected to the negative electrode conductive sheet 168 of the second conductive sheets 164 through the blind vias 172.

In FIG. 1A, a first capacitance C1 is formed in the first distribution region 116, while a second capacitance C2 is formed in the second distribution region 118. The etching depth of the aluminum substrate in the first distribution region 116 is smaller than the etching depth of the aluminum substrate in the second distribution region 118. That is, the first depth 116H is smaller than the second depth 118H. In the region with the larger etching depth, the porous structure 121 has a relatively larger surface area, thus leading to a larger effective capacitance area. Hence, the second capacitance C2 is larger than the first capacitance C1.

In addition, as the blind vias 172 are located in the shallower first distribution region 116 having smaller etching depth, shorter current loop is provided through the connection of the blind vias 172 between the second electrode 130 and the negative electrode conductive sheet 168, which contributes to lower parasitic inductance of the capacitor 100 in the present disclosure.

Figure 1B:
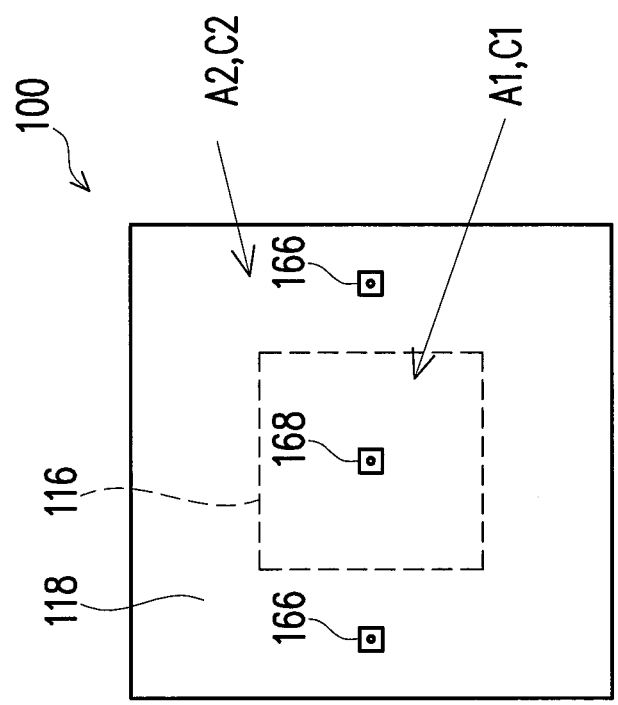

FIG. 1B is the schematic top view of the capacitor 100 in FIG. 1A. Referring to FIG. 1B, the first region A1 corresponds to the first distribution region 116 of FIG. 1A, while the second region A2 corresponds to the second distribution region 118. The first distribution region 116 is surrounded by the second distribution region 118. For the capacitor 100, the first capacitance C1 of the central first region A1 is smaller than the second capacitance C2 of the surrounding second region A2. Therefore, the central first region A1 can depress noises of higher frequencies, and the surrounding second region A2 that is electrically connected to the positive electrode conductive sheets 166 via the through vias 174 can depress noises of lower frequencies. The capacitor 100 can depress wideband noises. The first capacitance C1 of the central first region A1 may be larger or smaller than the second capacitance C2 of the surrounding second region A2.

Figure 2A:
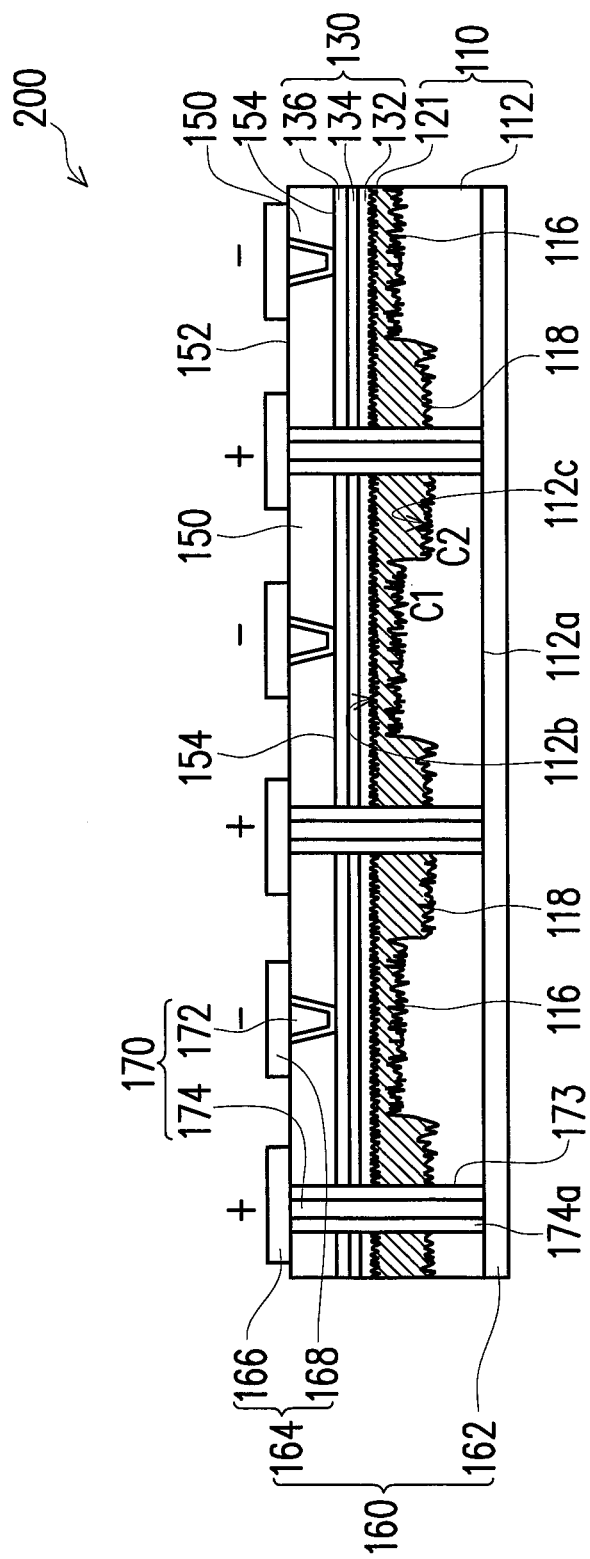
FIGS. 2A and 2B respectively show the cross-sectional view and the top view of a capacitor having the solid electrolytic capacitors arranged in an array according to the present disclosure.
Figure 2B:
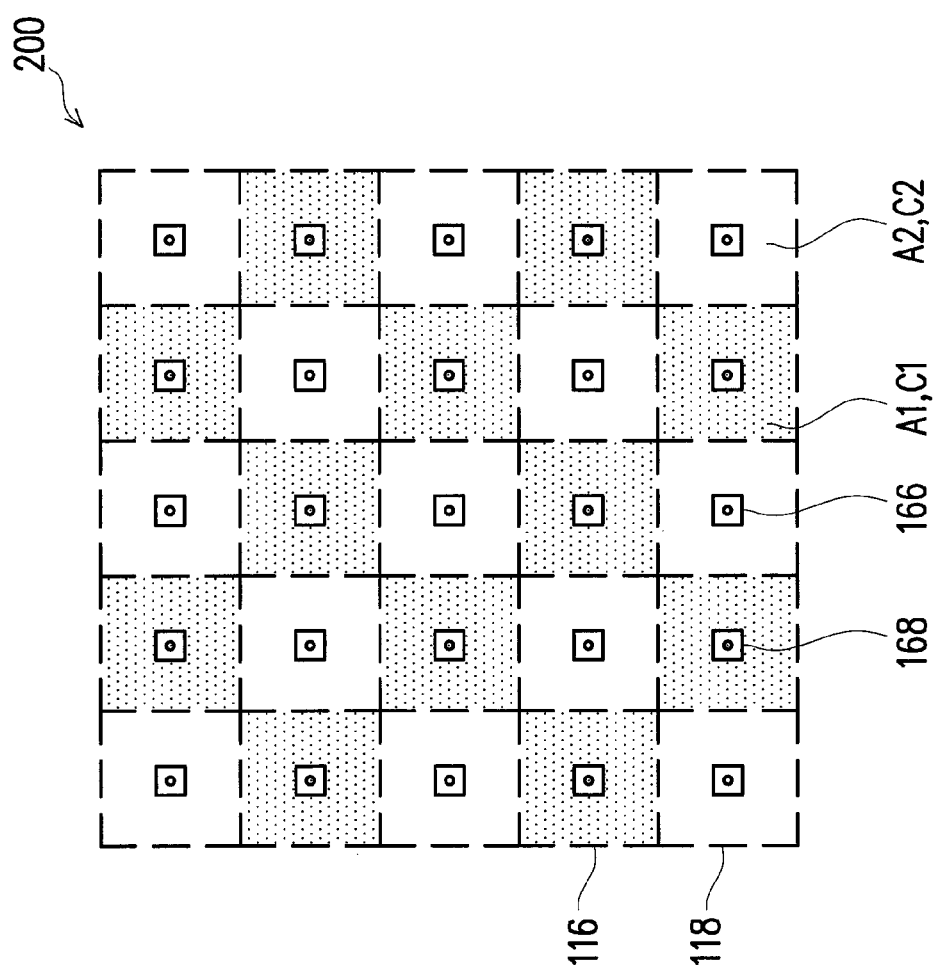

FIG. 2A shows the cross-sectional view of an array-type capacitor according to the present disclosure. FIG. 2B is the top view of FIG. 2A. Referring to FIGS. 2A & 2B, the capacitor 200 includes a plurality of solid electrolytic capacitor structures arranged in arrays. The solid electrolytic capacitor structure has at least a distribution region of a depth, relative to the second electrode 130. For the capacitor 200 in this disclosure, every two adjoining solid electrolytic capacitor structures include at least one first distribution region 116 and at least one second distribution region 118. In this embodiment, the solid electrolytic capacitor structure as described in FIG. 1A is employed for illustration, but the structure is not limited by these examples. For the convenience of descriptions, the same elements of the solid electrolytic capacitor structure in FIG. 2A and FIG. 1A are marked by the same reference number and will not be described in details hereinafter.

In this embodiment, since every two adjoining solid electrolytic capacitor structures include different distribution regions, the first distribution regions 116 and the second distribution regions 118 are adjoined and periodically arranged in alternation. Because the first capacitance C1 in the first distribution region 116 is smaller than the second capacitance C2 in the second distribution region 118, the second regions A2 having the larger capacitance and the first regions A1 having the smaller capacitance are alternately arranged in the array of the solid electrolytic capacitors. However, the first region A1 may have a capacitance value different from that of the second region A2, and the area thereof, the depth of the porous structure may be designed or modified according to the electrical property requirements. The design of this embodiment employ the arrangement in arrays but the scope of this disclosure should not be limited accordingly.

Figure 3A:
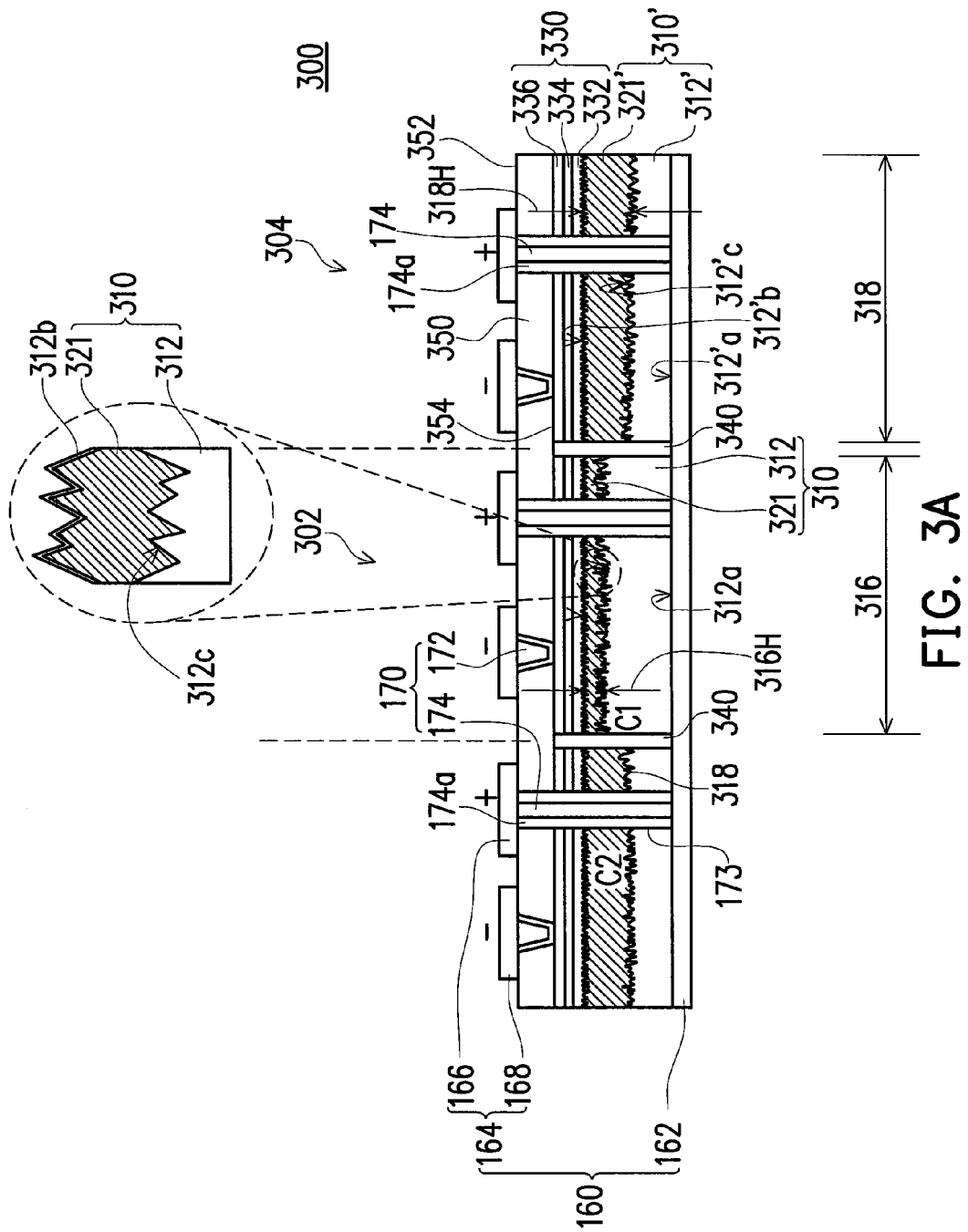

FIG. 3A shows the cross-sectional view of a capacitor according to the present disclosure. FIG. 3B is the top view of FIG. 3A, and FIG. 3C shows the equivalent circuit of FIG. 3A. For the convenience of descriptions, the same elements of the capacitor in FIG. 3A and FIG. 1A are marked by the same reference number and will not be described in details hereinafter. Referring to FIGS. 3A and 3B, the capacitor 300, such as a solid electrolytic capacitor substrate module, includes a plurality of solid electrolytic capacitor structures. In the embodiments, first and second solid electrolytic capacitor structures 302 and 304 are illustrated as one of embodiments in FIGS. 3A and 3B, but not limited thereto. The first and second solid electrolytic capacitor structures 302 and 304 are respectively located in a first distribution region 316 and a second distribution region 318. The first solid electrolytic capacitor structure 302 is surrounded by the second solid electrolytic capacitor structure 304, for example, as shown in FIG. 3B. An insulating slot 340 is formed between the first solid electrolytic capacitor structure 302 and the second solid electrolytic capacitor structure 304, for electrically isolated from each other.

The first solid electrolytic capacitor structure 302 includes a first substrate 310. The first substrate 310 includes a first electrode 312 and a first porous structure 321. The first electrode 312 includes a first surface 312a and a second surface 312c opposite to the first surface 312a. The first porous structure 321 is formed on the second surface 312c. The first porous structure 321 in the first distribution region 316 has a first depth 316H. A first oxide layer 312b is disposed on a surface of the first porous structure 321.

The first solid electrolytic capacitor structure 302 further includes a second electrode 330, disposed on the first oxide layer 312b. The second electrode 330 may include a conductive polymer material layer 332. In one embodiment, the conductive polymer material layer 332 is coated on the oxide layer 312b and the second electrode 330 may be the conductive polymer material layer 332 alone. In another embodiment, the second electrode 330 may further include a carbon-containing layer 334 and a conductive silver paste layer 336 for better electrical conductivity. In another embodiments, solder paste can be used to replace the silver paste. The carbon-containing layer 334 is disposed on the conductive polymer material layer 332 and the conductive silver paste layer 336 is disposed on the carbon-containing layer 334.

The second solid electrolytic capacitor structure 304 includes a second substrate 310', the second electrode 330, and the second oxide layer 312'b. The second substrate 310' comprising a third electrode 312' and a second porous structure 321'. The third electrode 312' includes a third surface 312'a and a fourth surface 312'c opposite to the third surface 312'a. The second porous structure 321', formed on the fourth surface 312'c in a second distribution region 318, substantially has a second depth 318H. A second oxide layer 312'b is disposed on a surface of the second porous structure 321'. The second electrode 330 is disposed on the second oxide layer 312'b. The first depth 316H of the first porous structure 321 is smaller than the second depth 318H of the second porous structure 321'.

An insulating layer 350 is disposed on the first and second solid electrolytic capacitor structures 302 and 304. The insulating layer 350 has a fifth surface 352 and a sixth surface 354 opposite to the fifth surface 352. The sixth surface 354 of the insulating layer 350 is connected with the second electrode 330 of the first solid electrolytic capacitor structure 302 and the fourth electrode 330' of the second solid electrolytic capacitor structure 304.

The capacitor 300 further includes a plurality of conductive sheets 160 and a plurality of vias 170 as shown in FIG. 3A. Some of the plurality of conductive sheets 160 are respectively disposed on the first surface 312'a of the first electrode 312 and the third surface 352 of the insulating layer 350 in the first solid electrolytic capacitor structure 302. Some of the plurality of conductive sheets 160 are respectively disposed on the first surface 312'a of the first electrode 312' and the third surface 352 of the insulating layer 350 in the second solid electrolytic capacitor structure 304. In this embodiment, the plurality of conductive sheets 160 includes a first conductive sheet 162 and a plurality of second conductive sheets 164. The first conductive sheet 162 is disposed on the first surface 312'a of the first electrode 310 of the first solid electrolytic capacitor structure 302, and also disposed on the third surface 312'a of the third electrode 312' of the second solid electrolytic capacitor structure 304. The second conductive sheets 164 are disposed on the fifth surface 352 of the insulating layer 350.

The vias 170 includes a plurality of blind vias 172 and a plurality of through vias 174 penetrating the insulating layer 350. The first conductive sheet 162 and the plurality of second conductive sheets 164 electrically connect with the corresponding vias according to different polarities.

In this embodiment, the first electrode 312 of the substrate 310 is electrically connected with the first conductive sheet 162 and electrically connected with the positive electrode conductive sheet 166 of the second conductive sheets 164 via the through vias 174. Different regions of the second electrode 330 are respectively electrically connected to the negative electrode conductive sheets 168 of the second conductive sheets 164 through the blind vias 172, thus providing a variety of capacitance values.

In FIG. 3B, the first region A1 of the capacitor 300 corresponds to the first distribution region 316 of FIG. 3A, while the second region A2 corresponds to the second distribution region 318. The first region A1 and the second region A2 are electrically isolated by the slot 340 in-between the first region A1 and the second region A2. The first solid electrolytic capacitor structure 302 is formed in the first region A1, which is the first distribution region 316 of FIG. 3A, and the second solid electrolytic capacitor structure 304 is formed in the second region A2, which is the second distribution region 318 of FIG. 3A.

As shown in the equivalent circuit of FIG. 3C, the first region A1 has a first capacitor C1, a parasitic inductor L1 and a parasitic resistor R1, while the second region A2 has a second capacitor C2, a parasitic inductor L2 and a parasitic resistor R2. When the negative electrode conductive sheet 168 in different regions are electrically connected to one another, the capacitors generated by different regions of the solid electrolytic capacitor structure can be connected in parallel, which further lowers the parasitic capacitance value of the solid electrolytic capacitor structures.

Figure 4A:
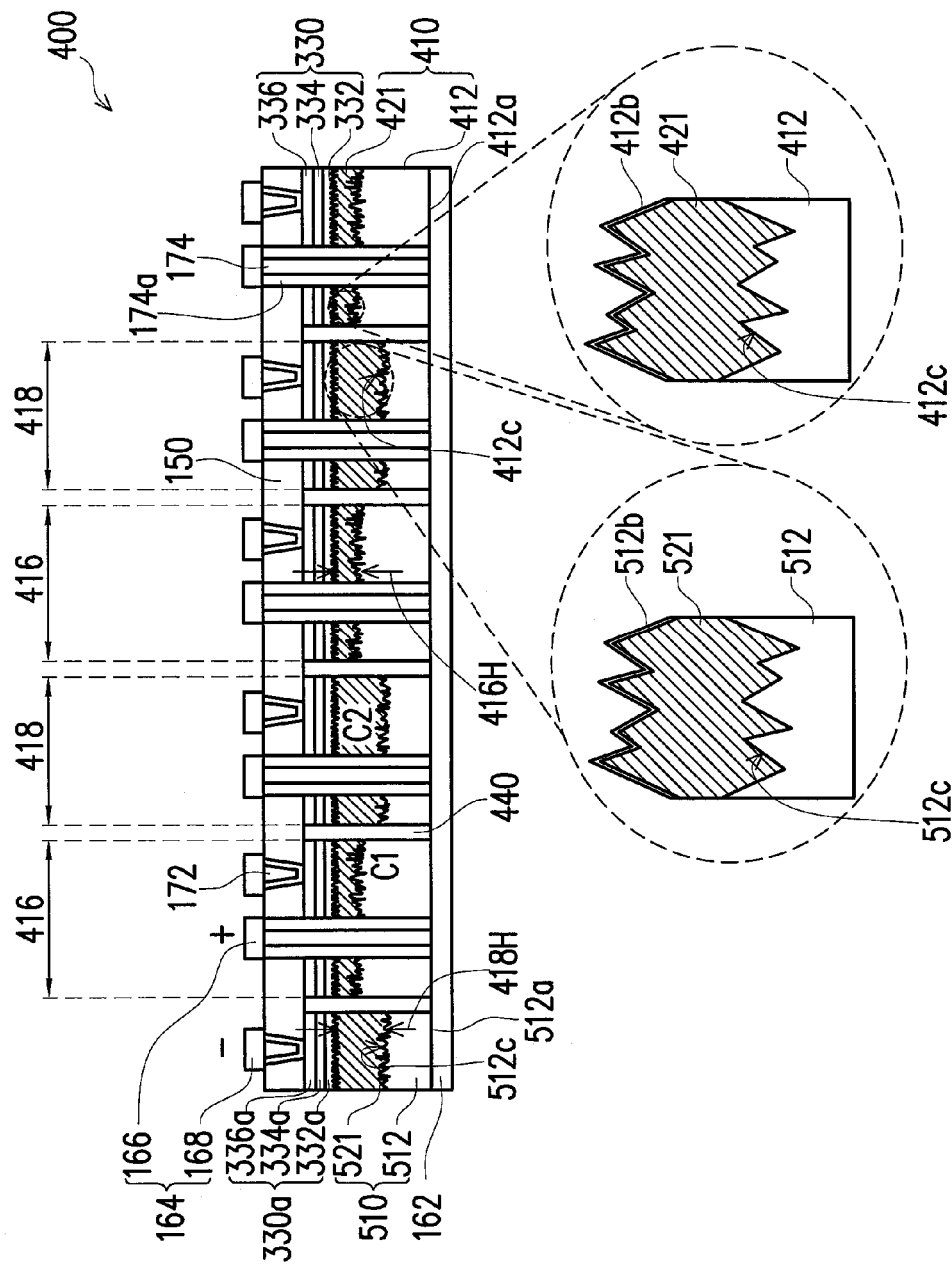
FIGS. 4A, 4B and 4C respectively show the cross-sectional view, the top view and the equivalent circuit of a capacitor having the solid electrolytic capacitors arranged in an array according to the present disclosure.
Figure 4B:
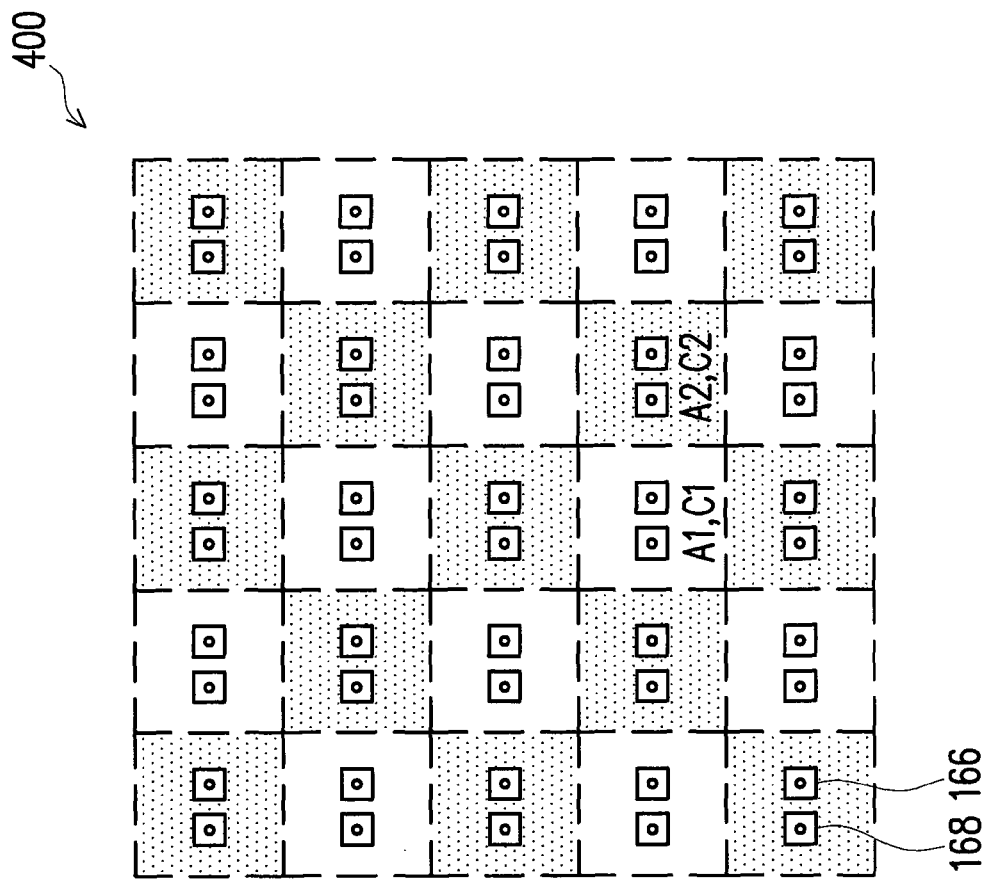
Figure 4C:
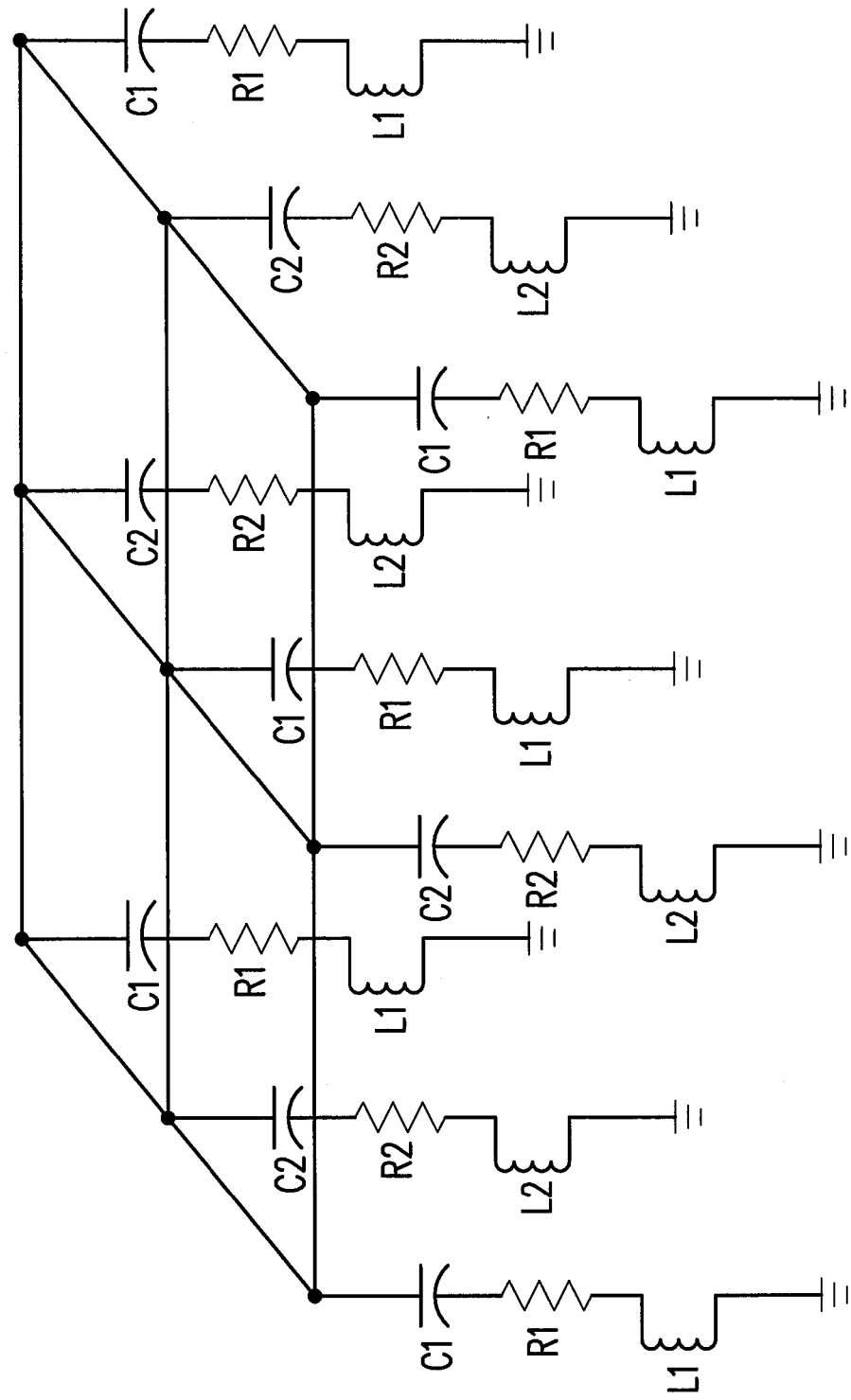

FIG. 4A shows the cross-sectional view of an array-type capacitor according to the present disclosure. FIG. 4B is the top view of FIG. 4A, and FIG. 4C shows the equivalent circuit of FIG. 4A. For the convenience of descriptions, the same elements of the capacitor are marked in FIG. 4A and FIG. 1A by the same reference number and will not be described in details hereinafter.

Referring to FIGS. 4A & 4B, the capacitor 400 includes a plurality of first solid electrolytic capacitor structures and a plurality of second solid electrolytic capacitor structures. The first solid electrolytic capacitor structure includes a first substrate 410 and the second electrode 330. The first substrate 410 includes a first electrode 412 and a first porous structure 421. The first electrode 412 has a first surface 412a and second surface 412c, and the first porous structure 421 is formed on the second surface 412c of the first electrode 412 opposite to the first surface 412a. The depth of the first porous structure 421 in a first distribution region is the first depth 416H. Fabricated by the electrochemical process, a first oxide layer 412b is formed on the surface of the first porous structure 421 with a high surface area. The second electrode 330 is disposed on the oxide layer 412b. In the embodiment, for example, the second electrode 330 includes a conductive polymer material layer 332, a carbon-containing layer 334 and a conductive silver paste layer 336.

The second solid electrolytic capacitor structure includes a second substrate 510 and the fourth electrode 330a. The second substrate 510 includes a third electrode 512 and a second porous structure 521. The third electrode 512 has a third surface 512a and fourth surface 512c. The second porous structure 521 is formed on the fourth surface 512c of the third electrode 512 opposite to the third surface 512a of the third electrode 512. The depth of the second porous structure 521 in a second distribution region is the second depth 418H. Fabricated by the electrochemical process, a second oxide layer 512b is formed on the surface of the second porous structure 521 with a high surface area. The fourth electrode 330a is disposed on the oxide layer 512b. The fourth electrode 330a includes a conductive polymer material layer 332a, a carbon-containing layer 334a and a conductive silver paste layer 336a, for example.

The insulating layer 150 is disposed on the second electrode 330 of the first solid electrolytic capacitor structure, and also disposed on the fourth electrode 330a of the second solid electrolytic capacitor structure.

As shown in FIGS. 4A and 4B, for the porous structures 421, 521 of the first and second substrate 410, 520, the first distribution regions 416 and the second distribution regions 418 are adjoined and arranged in alternation. The first depth 416H is smaller than the second depth 418H. In addition, the first distribution regions 416 and the second distribution regions 418 are electrically isolated from one another by the slot 440. From the top view of FIG. 4B, the array-type capacitor 400 comprises of a plurality of first distribution regions 416 and a plurality of second distribution regions 418 arranged in arrays. The first capacitance C1 in the first distribution region 416 (first region A1 in FIG. 4B) is smaller than the second capacitance C2 in the second distribution region 418 (second region A2 in FIG. 4B). The second regions A2 having the larger capacitance and the first regions A1 having the smaller capacitance are alternately arranged in the array of the solid electrolytic capacitors in FIG. 4B. However, the first region A1 may have a capacitance value different from that of the second region A2. The area of the first region A1 and the second region A2 and the depth of the porous structure may be designed or modified according to the electrical property requirements. The design of this embodiment employ the arrangement in arrays but the scope of this disclosure should not be limited accordingly.

As shown in the equivalent circuit of FIG. 4C, by arranging the first distribution regions 416 and the second distribution regions 418 in arrays and electrically connecting the negative electrode conductive sheet 168 in different regions, the capacitors generated in different regions of the solid electrolytic capacitor structures can be arranged in the array-type and connected in parallel, which accordingly further lowers the parasitic inductance value of the solid electrolytic capacitor structures.

Figure 5:
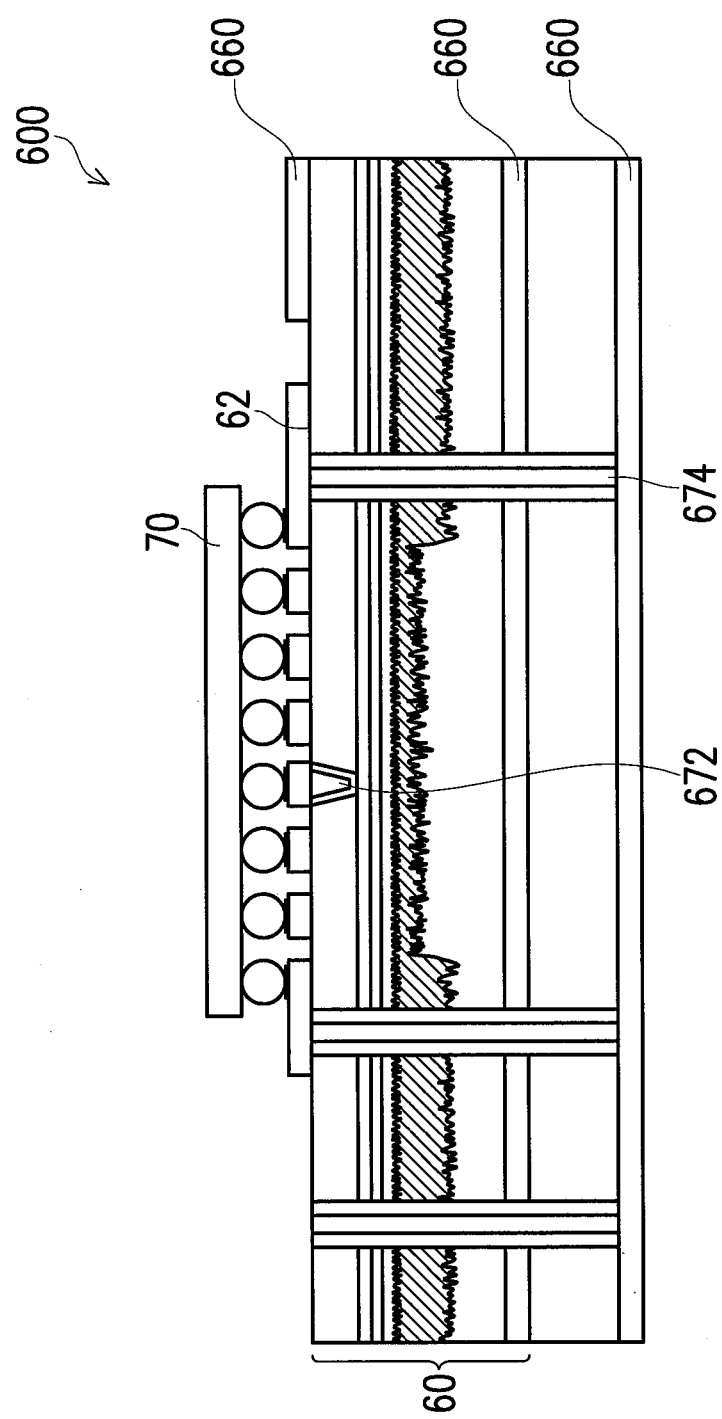
FIG. 5 is a schematic cross-sectional view illustrating a printed circuit board using the capacitor according several embodiments of the present disclosure.

FIG. 5 is a schematic cross-sectional view illustrating a printed circuit board using the capacitor according several embodiments of the present disclosure. Referring to FIG. 5, the capacitor 60 in the printed circuit board 600 may be any module shown in FIGS. 1A-4C. The integrated circuit 70 is electrically connected to the capacitor 60 by way of the blind vias 672 and the through vias 674. Through the formation of the conductive sheets 660, the capacitors can be connected in parallel, thus providing the acceptable capacitance for the integrated circuit 70. The solid electrolytic capacitor structures and the substrate modules described in the present disclosure can be embedded or applied in the flexible or rigid printed circuit boards or IC carriers to provide desirable capacitance for the integrated circuits.

In light of the foregoing, as the porous structure of the substrate has various depths in different distribution regions, the capacitor can provide a variety of capacitance values. The distribution region having a larger depth of the porous structure simultaneously has larger conductive surface area and larger capacitance value. According to one of the several embodiments of this disclosure, the solid electrolytic capacitor structures are periodically arranged in arrays to form the capacitor and the negative electrodes in different distribution regions are electrically connected by traces, which lowers the parasitic inductance value of the capacitive substrate module.

It will be apparent to those skilled in the art that various modifications and variations can be made to the structure described in the disclosure without departing from the scope or spirit of the disclosure. In view of the foregoing, it is intended that the disclosure cover modifications and variations of this disclosure provided they fall within the scope of the following claims and their equivalents.

What is claimed is:

1. A capacitor, comprising:
    a substrate, having a first electrode and a porous structure, wherein the first electrode has a first surface and a second surface opposite to the first surface, the porous structure is disposed on the second surface, the porous structure in a plurality of distribution regions have different depths, wherein the distribution regions includes a first and a second distribution regions, the porous structure in the first distribution region has a first depth relative to the second electrode and a first capacitance, the porous structure in the second distribution region has a second depth relative to the second electrode and a second capacitance, the first depth is smaller than the second depth, and the first capacitance is unequal to the second capacitance;
    an oxide layer, disposed on a surface of the porous structure;
    a second electrode, disposed on the oxide layer and including a conductive polymer material layer;
    an insulating layer, disposed on a surface of the second electrode away from the substrate, wherein the insulating layer has a third surface and a fourth surface opposite to the third surface, and the fourth surface is connected with the second electrode;
    a plurality of conductive sheets, respectively disposed on the first surface of the first electrode and the third surface of the insulating layer; and
    a plurality of vias, electrically connected with the corresponding conductive sheets according to different polarities.

2. The capacitor as recited in claim 1, wherein the substrate is an aluminum substrate.

3. The capacitor as recited in claim 1, wherein the second electrode further comprises:
    a carbon-containing layer, disposed on the conductive polymer material layer; and
    a conductive silver paste layer, disposed on the carbon-containing layer.

4. The capacitor as recited in claim 1, wherein the first and the second distribution regions are adjoined and arranged in alternation.

5. The module as recited in claim 1, further comprising a slot disposed between the first and the second distribution regions, wherein the first electrode and the second electrode within the first distribution region and the second distribution region are electrically isolated from each other by the slot.

6. The capacitor as recited in claim 1, wherein the vias further comprises:
    a plurality of blind vias, wherein, the blind vias penetrate through the insulating layer and are electrically connected with the second electrode through the conductive layer; and
    a plurality of through vias, wherein the through vias penetrating through the insulating layer, the second electrode and the substrate and are electrically connected with the conductive sheets, respectively.

7. The capacitor as recited in claim 1, wherein the conductive sheets further comprises:
    a plurality of first conductive sheets, disposed on the first surface of the first electrode and electrically connected with the first electrode; and
    a plurality of second conductive sheets, disposed on the third surface of the insulating layer.

8. A circuit board having the capacitor as recited in claim 1 embedded therein.

9. A capacitor, comprising:
    a plurality of solid electrolytic capacitor structures, arranged in an array, wherein each solid electrolytic capacitor structure comprises:
        a substrate, having a first electrode and a porous structure, wherein the first electrode has a first surface and a second surface opposite to the first surface, the porous structure is disposed on the second surface;
        an oxide layer, disposed on a surface of the porous structure; and
        a second electrode, disposed on the oxide layer and including a conductive polymer material layer, wherein the porous structures of at least two of the solid electrolytic capacitor structures have different depths, and wherein the porous structures of the at least two solid electrolytic capacitor structures respectively comprise a first porous structure located in a first distribution region and a second porous structure located in a second distribution region, the first porous structure in a first distribution region has a first depth relative to the second electrode and a first capacitance, the second porous structure in the second distribution region has a second depth relative to the second electrode and a second capacitance, the first depth is smaller than the second depth, and the first capacitance is unequal to the second capacitance;
    an insulating layer, disposed over the plurality of the solid electrolytic capacitor structures, wherein the insulating layer has a third surface and a fourth surface opposite to the third surface, and the fourth surface is connected with the second electrodes of the solid electrolytic capacitor structures;
    a plurality of conductive sheets, respectively disposed on the first surfaces of the first electrodes of the solid electrolytic capacitor structures and the third surface of the insulating layer; and
    a plurality of vias, electrically connected with the corresponding conductive sheets according to different polarities.

10. The capacitor as recited in claim 9, wherein the substrate is an aluminum substrate.

11. The capacitor as recited in claim 9, wherein the second electrode further comprises:
    a carbon-containing layer, disposed on the conductive polymer material layer; and
    a conductive silver paste layer, disposed on the carbon-containing layer.

12. The capacitor as recited in claim 9, wherein the first and the second distribution regions are adjoined and arranged in alternation.

13. The capacitor as recited in claim 9, further comprising a slot disposed between the first and the second distribution regions, wherein the first electrode and the second electrode within the first distribution region and the second distribution region are electrically isolated from each other by the slot.

14. The capacitor as recited in claim 9, wherein the vias further comprises:
 a plurality of blind vias, the blind vias penetrate through the insulating layer and are electrically connected with the second electrode through the conductive layer, and
 a plurality of through vias, wherein the through vias penetrate through the insulating layer and the solid electrolytic capacitor structures and are electrically connected with the conductive sheets, respectively.

15. The capacitor as recited in claim 9, wherein the conductive sheets further comprises:
 a plurality of first conductive sheets, disposed on the first surface of the first electrode and electrically connected with the first electrode; and
 a plurality of second conductive sheets, disposed on the third surface of the insulating layer.

16. A circuit board having the capacitor as recited in claim 9 embedded therein.

17. A capacitor, comprising:
 a plurality of first solid electrolytic capacitor structures and a plurality of second solid electrolytic capacitor structures, arranged coplanarly and alternately arranged in an array, wherein an insulating slot is formed between each first solid electrolytic capacitor structure and each second solid electrolytic capacitor structure,
 wherein each first solid electrolytic capacitor structure comprises:
  a first substrate, comprising a first electrode and a first porous structure, wherein the first electrode comprises a first surface and a second surface opposite to the first surface, the first porous structure is disposed on the second surface, the first porous structure in a first distribution region having a first depth relative to the second electrode and a first capacitance;
  a first oxide layer, disposed on a surface of the first porous structure; and
  a second electrode, disposed on the first oxide layer and comprising a conductive polymer material layer,
 each second solid electrolytic capacitor structure comprises:
  a second substrate, comprising a third electrode and a second porous structure, wherein the third electrode comprises a third surface and a fourth surface opposite to the third surface, the second porous structure is disposed on the fourth surface, the second porous structure in a second distribution region having a second depth relative to the second electrode and a second capacitance;
  a second oxide layer, disposed on a surface of the second porous structure; and
  a fourth electrode, disposed on the second oxide layer and comprising a conductive polymer material layer, wherein the first depth is smaller than the second depth, and the first capacitance is unequal to the second capacitance;
 an insulating layer having a fifth surface and a sixth surface opposite to the fifth surface, and the sixth surface of an insulating layer is connected with the second electrodes of the first solid electrolytic capacitor structures and the fourth electrodes of the second solid electrolytic capacitor structures;
 a plurality of conductive sheets, respectively disposed on the first surfaces of the first electrodes of the first solid electrolytic capacitor structures, on the third surfaces of the third electrodes of the second solid electrolytic capacitor structures and on the fifth surface of the insulating layer; and
 a plurality of vias, electrically connected with the conductive sheets, respectively.

18. A circuit board having the capacitor as recited in claim 17 embedded therein.

* * * * *